United States Patent [19]
Mazgy

[11] 4,228,371
[45] Oct. 14, 1980

[54] LOGIC CIRCUIT

[75] Inventor: James D. Mazgy, Parsippany, N.J.

[73] Assignee: RCA Corporation, New York, N.Y.

[21] Appl. No.: 857,759

[22] Filed: Dec. 5, 1977

[51] Int. Cl.² .............................................. H03K 17/00
[52] U.S. Cl. ................................. 307/317 A; 307/254; 307/270; 307/300; 307/310; 357/15
[58] Field of Search .................... 307/317 A, 270, 300, 307/310, 214; 357/15

[56] References Cited
U.S. PATENT DOCUMENTS

| 3,751,680 | 8/1973 | Hodges | 307/317 A |
| 3,836,789 | 9/1974 | Struk et al. | 307/317 A |

OTHER PUBLICATIONS

IBM Tech. Dsclre. Blltn., True Complement Generator Circuit with Schottky Barrier Diodes, by S. J. Park, vol. 16, No. 4, 9/73, p. 1280.

Schottky Diode has 0.5-volt drop at 50 amps, Electronics, 1/5/70, pp. 180-182.

Primary Examiner—Stanley D. Miller, Jr.
Assistant Examiner—B. P. Davis
Attorney, Agent, or Firm—H. Christoffersen; Henry I. Schanzer

[57] ABSTRACT

A logic circuit in which a phase splitting transistor is connected at its emitter to the base of an output pull-down transistor having a bypass network connected between its base and emitter. The bypass network, comprised of a resistor in series with a Schottky diode, enables the phase splitting transistor to be turned on and off prior to the corresponding turn-on and turn-off of the pull-down transistor, provides a path for discharging the base of the pull-down transistor and for passing its collector-to-base leakage, and compensates for temperature variations of the pull-down transistor to maintain the propagation delay of the logic circuit relatively constant over a wide temperature range.

5 Claims, 4 Drawing Figures

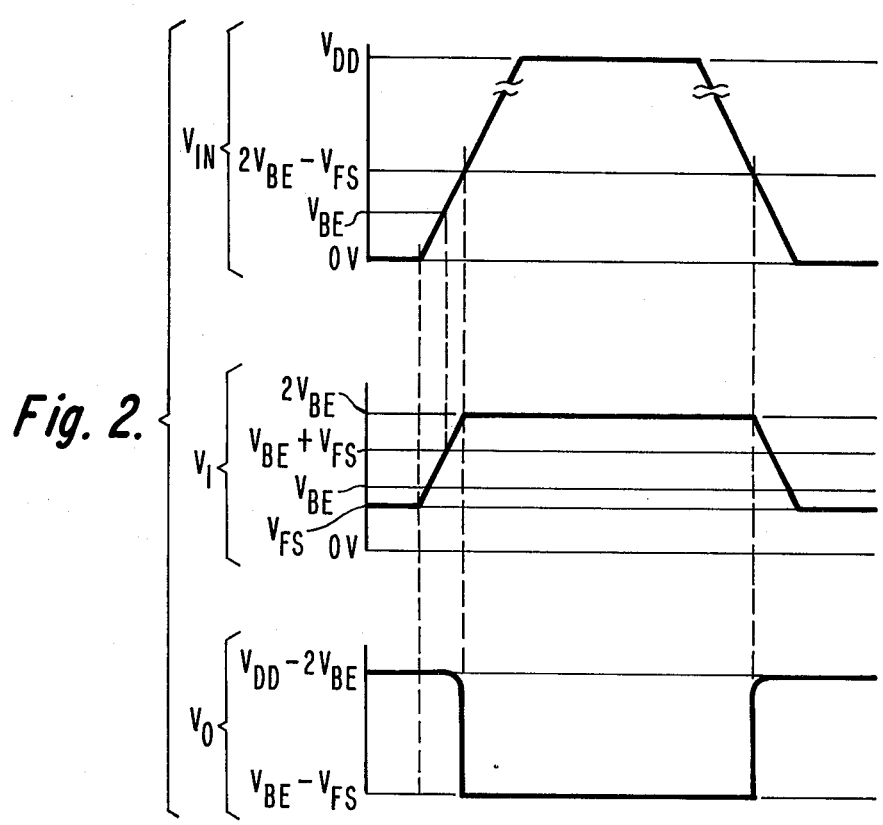
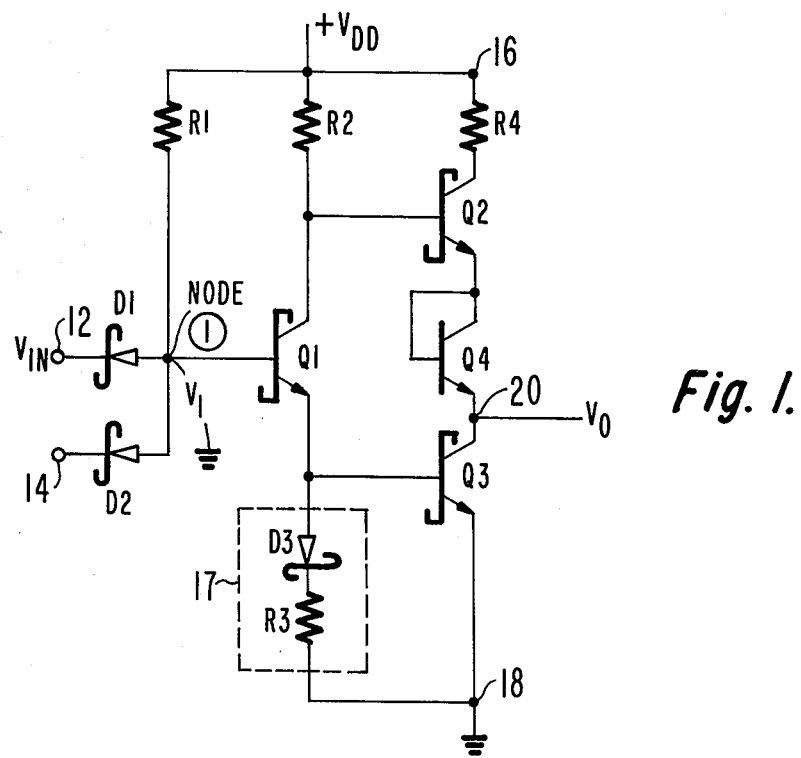
Fig. 2.
Fig. 1.

LOGIC CIRCUIT

STATEMENT

The invention herein described was made in the course of, or under, a contract (or subcontract thereunder, or grant) with the Department of the Navy.

This invention relates to a relatively high speed low power Schottky integrated logic circuit.

Known DTL and TTL logic circuits include an output pull-down transistor and an output pull-up transistor with the output terminal of the logic circuit being connected to the emitter of the pull-up transistor and to the collector of the pull-down transistor. A phase splitting transistor is coupled at its collector to the base of the pull-up transistor and at its emitter to the base of the pull-down transistor. The output transistors are turned on and off as a function of the value of the signals coupled to the base of the phase splitter. When a signal applied to the base of the phase splitter is above a predetermined level, the pull-down transistor is turned on and clamps the output of the circuit to a point of reference potential, such as ground, while the pull-up transistor is turned off. When the signal is below the predetermined level, the pull-down transistor is turned off while the pull-up transistor is turned on and couples the output to a positive point of operating potential.

A problem with prior art circuits is that their switching speeds are severely limited by the time required to turn-off the pull-down transistor. The turn-off time depends to a great extent on the time required for the base charge to be removed from the base of the output pull-down transistor.

A known reference, U.S. Pat. No. Re. 27,804, entitled "Transistor-Transistor Logic Circuits Having Improved Voltage Transfer Characteristic" issued Oct. 30, 1973 to R. L. Treadway, teaches the connection of a "bypass" ("pull-down" or "discharge") circuit comprised of a conventional PN junction diode in series with a resistor across the base-to-emitter region of the pull-down transistor. Although the circuit of the cited reference provides many advantages, many problems still exist. For example, where reliance is placed on turning-off the pull-down transistor with a conventional PN diode whose forward voltage drop ($V_F$) is, in general, of similar value to the $V_{BE}$ of the pull-down transistor the base of the pull-down transistor can not be discharged to a low level via the bypass network. Furthermore, with a conventional diode or PN junction (e.g. base-to-emitter of a transistor) in the bypass network, the phase splitting transistor turns-on or turns-off at the same time as the pull-down transistor. Consequently, the pull-up transistor is being turned-off or turned-on at the same time as the pull-down transistor is being turned-on or off. This results in "spike through" current flow between the power supply lines to the circuit via the series conduction paths of the pull-up and pull-down transistors.

In circuits embodying the invention, a bypass network, comprising a resistor in series with a unidirectional conducting element such as a Schottky barrier diode, is connected across the base-to-emitter region of the output pull-down transistor. The unidirectional conducting element has a lower forward drop ($V_{FS}$) than the $V_{BE}$ of the pull-down transistor is poled to conduct in the same forward direction as the base-to-emitter junction of the pull-down transistor.

In the accompanying drawings,

FIG. 1 is a schematic diagram of a logic gate embodying the invention;

FIG. 2 is a diagram of waveforms at various nodes of the circuit of FIG. 1; and

Figure 3A:
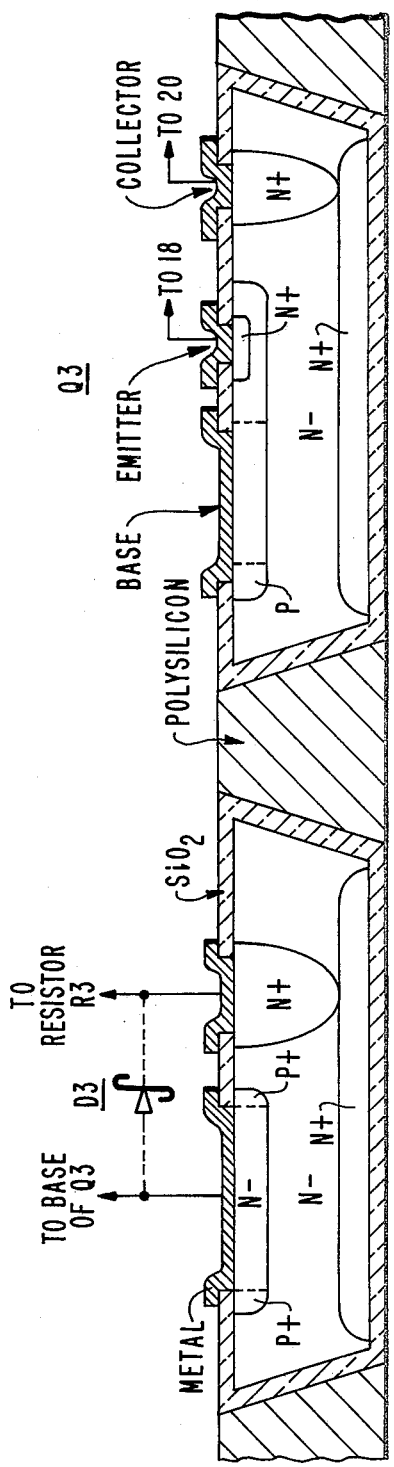
FIGS. 3A and 3B show a cross-section and top-view, respectively, of a portion of the output circuit of FIG. 1.

The circuit of FIG. 1 includes input terminals 12 and 14 to which are applied input signals ($V_{IN}$) varying in amplitude between a "low" or logic "0" level (less positive than $V_{BE}$) and a "high" or logic "1" level (more positive than $V_{DD}-2V_{BE}$). Schottky diodes D1 and D2 are connected at their cathodes to terminals 12 and 14, respectively, and at their anodes to node 1. A resistor R1 is connected between node 1 and terminal 16 to which is applied an operating potential of $+V_{DD}$ volts, which may typically be equal to 5 volts. Also connected to node 1 is the base of a phase splitting transistor Q1 whose collector is connected to one end of a resistor R2 and to the base of a "pull-up" (current sourcing) transistor Q2. The other end of resistor R2 is connected to terminal 16. A current limiting resistor R4 is connected between the collector of Q2 and terminal 16. The emitter of transistor Q1 is connected to the base of a "pull-down" (current sinking) transistor Q3. A Schottky barrier diode D3 and a resistor R3, forming a bypass ("discharge", or "pull-down") network 17, are connected in series between the emitters of transistors Q1 and Q3. Diode D3 is poled to conduct current in the same forward direction as the base-to-emitter junction of transistor Q3. The emitter of transistor Q3 is connected to terminal 18 to which is applied ground potential. The collector of transistor Q3 is directly connected to output terminal 20 at which is produced an output signal $V_O$. The emitter of transistor Q2 is coupled to terminal 20 via diode connected transistor Q4 whose emitter is connected to terminal 20 and whose base and collector are connected to the emitter of Q2.

NPN transistors Q1, Q2 and Q3 are Schottky clamped transistors which means that a Schottky diode is formed or connected between their base and collector junctions. Generally, the Schottky diode prevents the transistor from being driven deeply into saturation since the forward drop ($V_{FS}$) of the Schottky diode is less than the forward drop ($V_{BE}$) of a transistor. Furthermore, since there is no stored charge on the Schottky diode, the turn-off time of a Schottky transistor is, typically, much shorter than that of conventional transistors driven into saturation.

To better understand the operation of the circuit of FIG. 1, the following definitions and assumptions are noted.

The Schottky diodes are assumed to have a forward drop ($V_{FS}$) of 0.55 volt at 25° C. and at 1 milliampere of current. The forward drop ($V_F$) of a conventional diode (PN junction) and the forward base-to-emitter voltage drop ($V_{BE}$) of the transistors used in the circuit are assumed to be equal to 0.8 volt at 25° C. and at 1 milliampere of current across the junction. As used herein, the terms "unidirectional conducting element", "diode" or "rectifying junctions" are meant to include PN junctions and Schottky barrier diodes. The terms "PN junction" or "conventional diode" are meant to exclude Schottky diodes. It is assumed that the minimum collector-to-emitter voltage of Schottky clamped transistors Q1, Q2 or Q3, when turned-on hard, is $V_{BE}-V_{FS}$ and hence is of the order of 0.25 volt.

The operation of the circuit of FIG. 1 may now best be explained with reference to the waveforms of FIG. 2. Assume that $V_{IN}$ is applied to terminal 12 and that $V_{IN}$ is increasing from zero volts towards $V_{DD}$ volts. (The response of input diodes D1 and D2 are the same and, therefore, the input voltage ($V_{IN}$) at only one of the two input terminals is discussed below). For $V_{IN}$ more positive than zero volts and less than $2V_{BE}-V_{FS}$, the potential at node ①, $V_1$, is equal to $V_{IN}+V_{FS}$. That is, $V_1$ is more positive than $V_{IN}$ by the voltage drop ($V_{FS}$) across the input diode D1.

For values of $V_{IN}$ less positive than $V_{BE}$, $V_1$ is less positive than $V_{BE}+V_{FS}$, transistor Q2 is turned-on hard while transistors Q1 and Q3 are turned-off. Current flows via resistor R2 into the base of transistor Q2. Output current then flows from terminal 16 via resistor R4 and the collector-to-emitter paths of transistors Q2 and Q4 into terminal 20. Assume that the voltage drop across resistor R2 is negligible. The potential at the base of transistor Q2 is then, to a rough approximation, equal to $+V_{DD}$. Assume also the voltage drop across R4 to be under 0.5 volt. The voltage ($V_{E2}$) at the emitter of transistor Q2 is then equal to $V_{DD}-V_{BE}$ and $V_0$ is then equal to $V_{DD}-2V_{BE}$. Transistor Q1 is turned-off until $V_{IN}$ reaches $V_{BE}$ and $V_1$ is equal to $V_{BE}+V_{FS}$, due to the presence of Schottky diode D3 connected between its emitter and ground. Thus, the zero noise margin (the lowest value of input signal to which the circuit is responsive) of the circuit is equal to $V_{BE}$ volts and is obtained by the addition of Schottky diode D3.

When $V_{IN}$ equals $V_{BE}$, $V_1$ equals $V_{BE}+V_{FS}$, transistor Q1 turns on. Transistor Q3 is still turned-off and remains turned off for all values of $V_1$ less than $2V_{BE}$. As soon as Q1 turns on, its collector current, drawn from terminal 16 via resistor R2, lowers the voltage at the base of Q2 and tends to turn it off. As a result, $V_{E2}$ and $V_0$ decrease. Simultaneously, the emitter current of transistor Q1 flows via bypass network 17 to ground. The turn-off of Q2 is more pronounced where the output load is highly capacitive and the capacitance associated with terminal 20 and/or the emitter of transistor Q2 prevents the discharge of these nodes. Thus, while the emitter voltage of Q2 is being held at its previously "high" value its base is being driven negative with respect to its emitter, cutting it off. Accordingly, the pull-up current sourcing transistor Q2 is being turned-off when $V_1$ equals $V_{BE}+V_{FS}$, prior to the turn-on of current sinking transistor Q3.

When $V_{IN}$ reaches and exceeds $2V_{BE}-V_{FS}$, $V_1$ becomes and remains equal to $2V_{BE}$, transistors Q1 and Q3 are turned-on and Q2 is turned-off. The threshold voltage (i.e. the point at which the output of the gate switches levels) is thus equal to $2V_{BE}$. As soon as Q3 turns on, $V_0$ goes towards ground potential. $V_0$ does not get clamped to ground because of the Schottky diode clamp between the base and collector of transistor Q3. $V_0$ drops to $V_{BE}-V_{FS}$ where $V_{FS}$ is the forward drop of the base-to-collector Schottky diode of transistor Q3. With $V_0$ at $V_{BE}-V_{FS}$, $V_{E2}$ is equal to $2V_{BE}-V_{FS}$. Concurrently, the emitter of transistor Q1 is at one $V_{BE}$ and its base is at $2V_{BE}$. The potential at the collector of Q1, as Q1 saturates, is then equal to $2V_{BE}-V_{FS}$. Hence, the base of Q2 is also at $2V_{BE}-V_{FS}$ and since its emitter is at the same potential transistor Q2 is indeed turned-off.

Recall that, due to bypass network 17, Q2 was being turned-off (when $V_1$ was equal to $V_{BE}+V_{FS}$) prior to the turn-on of Q3. Thus, the conduction paths of transistors Q2, Q3 and Q4 do not provide a low impedance path between terminals 16 and 18. This reduces, significantly, the spike-through currents that can flow in the conduction paths of output transistors Q2 and Q3.

The operation of the circuit for decreasing $V_{IN}$ will now be discussed.

As soon as $V_1$ becomes less positive than $2V_{BE}$, the voltage at the base of Q3 decreases below $V_{BE}$ and transistor Q3 begins to turn-off. However, there is charge stored at the base of transistor Q3 and it is important to sweep out that charge as quickly as possible. Diode D3 and resistor R3 function to discharge or pull-down the excess charge on the base of transistor Q3, relatively quickly. The $V_{FS}$ of diode D3 is less than the $V_{BE}$ of transistor Q3. This enables resistor R3 to sweep out the charge stored at the base of Q3, when the latter is being turned off.

As $V_1$ decreases below $2V_{BE}$, current from Q1 no longer flows into the base of Q3. Resistor R3 and diode D3 provide a relatively low impedance path for passing the emitter current of Q1 and for discharging the base of Q3. As $V_1$ decreases below $V_{BE}+V_{FS}$, Q1 turns-off completely, and the bypass network provides a low impedance conduction path to discharge the base of Q3 to $V_{FS}$. Since $V_{FS}$ is considerably less than $V_{BE}$ transistor Q3 is definitely turned-off.

Diode D3 and resistor R3 play a significant role in the turn-off of Q3 prior to the turn-on of Q2. As soon as $V_1$ decreases below $2V_{BE}$ the base drive to Q3 is interrupted. However, Q1 is still turned-on since the bypass network 17 provides a conduction path for its emitter current. Hence, Q2 is still turned-off. As $V_1$ decreases below $V_{BE}+V_{FS}$ transistor Q1 is turned-off and Q2 is turned-on. But, since Q3 is turned-off hard, substantially all the emitter current of transistor Q2 goes to drive the output terminal 20 towards $V_{DD}-2V_{BE}$ volts. Little, if any, current flows via the conduction path of Q3 to ground. Thus, the spike through current is substantially decreased during the turn-off of Q3 as well as during the turn-on of Q3 described above.

The bypass network 17 is also designed to maintain the propagation delay through the circuit relatively constant as a function of temperature. This is important where the circuit is to be operated over a wide temperature range (e.g. exceeding 100° C.). With increasing temperature, the $V_{BE}$ of the transistors decrease while their forward current gain ($\beta$) increase. Consequently, the base and collector currents of Q3 tend to increase with increasing temperature. There is some series resistance associated with Schottky diodes and this resistance increases with increasing temperature. Thus, with increasing temperature there is an increasing voltage drop across the Schottky diode connected between base and collector of Q3 and Q3 would go deeper into saturation in the absence of the bypass network of the invention. If Q3 were to go into deep saturation its turn-off time would increase and its switching speed decrease.

Schottky diode D3 is designed to prevent Q3 going into deep saturation. The compensating role of D3 may best be understood by noting some characteristics of the $V_{BE}$ of a transistor and the $V_{FS}$ of a Schottky diode. $V_{BE}$ and $V_{FS}$ decrease as a function of increasing temperature, with $V_{BE}$ decreasing faster than $V_{FS}$. Typically, $V_{BE}$ decreases at a rate of 1.8 millivolts per °C. rise while $V_{FS}$ decreases at a rate of 1.3 millivolts per °C. rise. But, the rate of change of $V_{BE}$ and $V_{FS}$ versus temperature is also a function of the current level and current density through the devices. In general, the larger the current through a forward biased diode, the lower is the change in its $V_{BE}$ or $V_{FS}$ versus temperature. In the circuit of FIG. 1, use is made of the fact that the forward current in bypass Schottky diode D3, is much lower than the emitter current through transistor Q3, when the latter is turned-on.

Figure 3B:
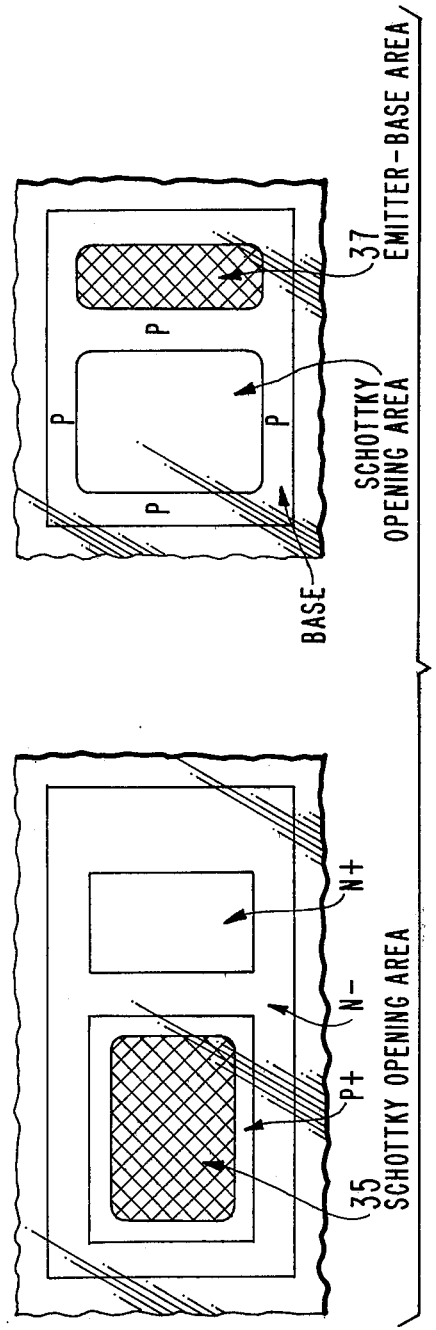

Also, Schottky diode D3, shown in cross-section in FIG. 3A, is made to have a larger rectifying area than the area of the base-to-emitter junction of transistor Q3 also shown in cross-section in FIG. 3A. The rectifying area 35 of D3 is larger than the area 37 of the base-to-emitter junction of Q3 as shown in the top view of D3 and Q3 in FIG. 3B. Thus, the series resistance of diode D3 is significantly decreased. Furthermore, the current density of D3 is much lower than that of the base-to-emitter junction of Q3 since the current through D3 is much less than the total emitter current through Q3, when the latter conducts. By way of example, the area of diode D3 may be twice that of the base-to-emitter of Q3 while its current level is one tenth that of Q3. Thus, the current density of D3 is 1/20th that of the base-to-emitter of Q3. Consequently, the $V_{FS}$ of D3 decreases as fast as, or faster than, the $V_{BE}$ of Q3 as a function of increasing temperature. As a result, increased emitter current supplied by Q1, as the temperature rises, will flow through D3 and R3 rather than into the base of Q3. By designing D3 to compensate, or even to overcompensate, for the temperature variations of Q3, more current is shunted away from the base of Q3 at elevated temperatures thereby preventing deep saturation of Q3 and ensuring a more constant turn-off time.

An important aspect of the circuit of the invention is its operation in a high nuclear radiation environment. Under nuclear radiation, the collector-to-base leakage current becomes very large. In the absence of a pull-down or low impedance path between the base and emitter the collector-to-base leakage current of Q3 (when turned off) flows back into the base causing an amplified (by beta) collector-to-emitter current to flow.

Known bypass circuits of the type shown in FIGS. 1–4 of the cited reference U.S. Pat. No. Re. 27,804 do not ensure that the output transistor remains cut-off under high leakage conditions. In these known circuits a resistor is connected in series with a conventional PN junction across the base-to-emitter of the output transistor. Since the PN junction has a similar $V_{BE}$ to that of the output transistor, part or all of the leakage current will flow back into the base of the output transistor, causing it to turn-on when it should be off. In sharp contrast thereto the low $V_{FS}$ of the Schottky diode D3 enables the passage of considerable leakage current to the ground terminal before any leakage current can flow back into the base of Q3.

It is evident from the discussion above that the $V_{FS}$ of the Schottky diode is sufficiently below $V_{BE}$ to enable conduction through the bypass network prior to conduction through the base-to-emitter of the output pull-down transistor in response to the application of forward bias signal. Although the invention has been illustrated using a Schottky diode, it should be evident that any unidirectional conducting element having an offset voltage (forward drop) which is less than the $V_{BE}$ of the output pull-down transistor and which tracks the $V_{BE}$ temperature variations could be used instead of the Schottky diode. It is important that the unidirectional conducting element have a forward drop or offset voltage which is sufficiently greater than zero to increase the noise margin of the circuit while being sufficiently below the turn on voltage of the output transistor to ensure conduction through the bypass network prior to conduction through the base-to-emitter junction of the output transistor. This enables a decreas in the spike through current and in the turn-off time of the output pull-down transistor.

What is claimed is:

1. The combination comprising:
   an input point for the application thereto of an input signal;
   an output point for producing thereat an output signal responsive to said input signal;
   first and second power terminals for the application therebetween of an operating potential;
   first and second transistors, each transistor having a base, an emitter and a collector;
   means connected between said input point and the base of said first transistor for coupling the input signal to the base of said first transistor;
   means connecting the collector of said first transistor to said first power terminal;
   means connecting the base of said second transistor to the emitter of said first transistor, the collector of said second transistor to said output point, and the emitter of said second transistor to said second power terminal;
   a resistor and a Schottky barrier diode; said diode characterized in that its forward drop is substantially greater than zero volts but less than the base-to-emitter forward drop ($V_{BE}$) of said second transistor and in that said diode has a larger rectifying area than the area of the base-to-emitter junction of said second transistor; and
   negligible impedance means connecting said resistor and said diode in series between the base and emitter of said second transistor; said Schottky barrier diode being poled to conduct current in the same forward direction as the base-to-emitter junction of said second transistor for enabling current flow through the diode prior to the flow of current through the base-to-emitter junction of the second transistor in response to a forward biasing signal applied to the base of said second transistor.

2. The combination as claimed in claim 1 further including a third transistor connected at its base to the collector of said first transistor; and
   means connecting its collector to said first power terminal, and its emitter to said output point.

3. The combination as claimed in claim 2 wherein the forward drop ($V_{FS}$) of said Schottky barrier diode is less than the $V_{BE}$ of said second transistor for the same value of current therethrough.

4. The combination as claimed in claim 3 wherein said first, second and third transistors are Schottky clamped transistors.

5. The combination as claimed in claim 3 wherein said first transistor is turned-on when the potential at its base is equal to $V_{BE}$ plus $V_{FS}$, and wherein said second transistor is turned on when the potential at the base of said first transistor is equal to $2V_{BE}$.

* * * * *